June 23, 1964 G. E. EVANS 3,138,768

MICROWAVE DIODE SWITCH HAVING BY-PASS MEANS TO CANCEL SIGNAL LEAK WHEN DIODE IS BLOCKED

Filed Dec. 17, 1962

INVENTOR.
Gary E. Evans,
BY
H. H. Losche
Paul S. Collignon
Att'ys.

3,138,768
MICROWAVE DIODE SWITCH HAVING BY-PASS MEANS TO CANCEL SIGNAL LEAK WHEN DIODE IS BLOCKED

Gary E. Evans, Jessup, Md., assignor, by mesne assignments, to the United States of America as represented by the Secretary of the Navy Filed Dec. 17, 1962, Ser. No. 245,334
5 Claims. (Cl. 333—97)

The present invention relates to a switching device and more particularly to a diode switch for use in a microwave circuit.

As microwave circuits become more complex, switches are required in a large number of different applications. For example, in computer and data processing systems, it is desirable to have switching circuits available which may be set to either of two states, and which remain in a given state until reset to another state. Also in modern day radar systems, various high speed switching devices are utilized in microwave circuits.

In particular, diode switches are potentially useful because they are extremely fast, inexpensive, small, and require only a very small amount of driving power. However, the major disadvantage of diode switches in low power applications is the limited available ratio of "off to on" loss ratio. This is especially true in TEM lines which are usually desirable for such low power devices. It is an object of the present invention to increase the "off to on" loss ratio.

In accordance with the present invention, a diode is connected in series with a TEM line conductor and has a diode junction resistance (R) and a junction capacitance (C), which is kept as small as possible for fast switching. When the switch is on, the diode is biased forward and the junction resistance (R) is small thereby by-passing C. When the switch is off, the diode is back-biased and the junction resistance (R) is large. However, at microwave frequencies, the value of R is engligible when compared to $$\frac{1}{\omega C}$$

and therefore the isolation of the switch is limited by C, rather than by R. Isolation is improved by tuning out C with a shunt. A fine wire has one end connected to the line conductor and is helically wound around the diode. The other end of the fine wire is then returned to the line conductor through a large capacitance in order to prevent short circuiting the bias. This fine wire shunt will increase a 15:1 db ratio to about a 40:1 db ratio over a 10 percent bandwidth.

It is therefore a general object of the present invention to provide an improved microwave diode switch.

Another object of the present invention is to provide a diode switch that has an increased off to on loss ratio.

Still another object of the present invention is to provide a fine wire shunt for tuning out capacitance in a microwave diode switch.

Other objects and advantages of the present invention will be readily appreciated as the same becomes better understood by reference to the following detailed description when considered in connection with the accompanying drawing wherein:

FIG. 2(*b*) is a diagrammatic view of an equivalent circuit showing the diode of FIG. 1 in an "on" condition;

FIG. 2(*c*) is a diagrammatic view of an equivalent circuit showing the diode of FIG. 1 in an "off" condition;

Figures 1, 2A:
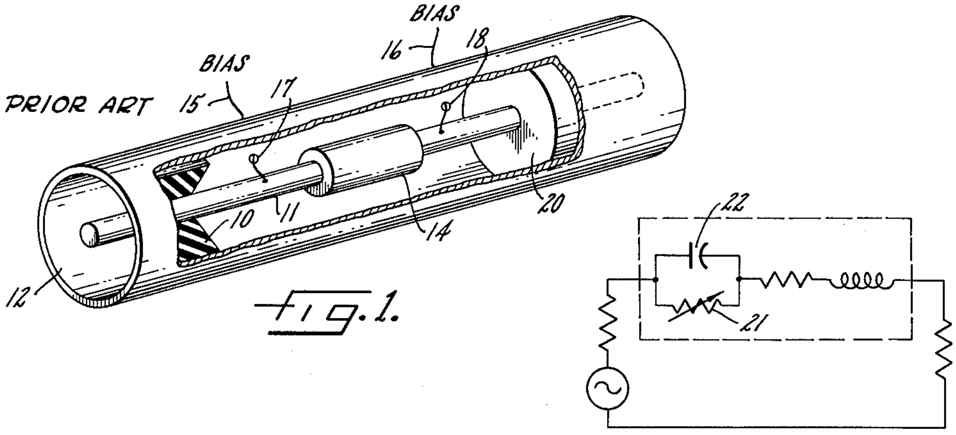
FIG. 1 is a perspective view, partially broken away, showing a diode switch connected to a line conductor.
Figure 3:
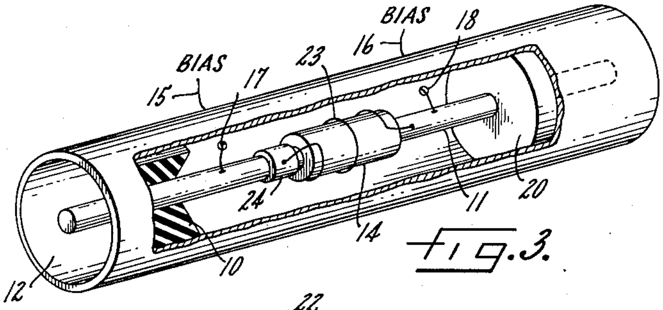
FIG. 3 is a perspective view showing a preferred embodiment of the present invention.

Referring now to the drawing, there is shown in FIGS. 1 and 3 a line conductor 11 that is coaxially supported in guide 12 by means of dielectric spacers 10 and 20. A crystal diode 14 is connected in series with the line conductor 11, and leads 15 and 16 are connected to line conductor 11 and pass through apertures 17 and 18 in guide 12. Leads 15 and 16 are connected to a suitable voltage source which provide the necessary bias on diode 14.

Figure 2B:
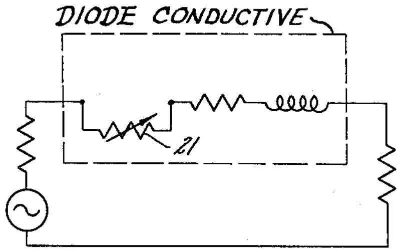
FIG. 2(*a*) is a diagrammatic view showing an equivalent circuit of the diode switch shown in FIG. 1.
Figure 2C:
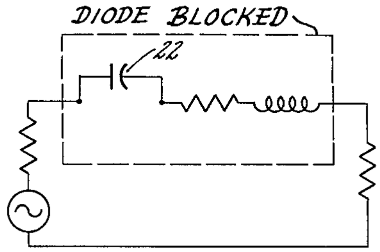

The equivalent circuit of the embodiment shown in FIG. 1 can be seen by reference to FIG. 2(*a*). Resistor 21 represents the diode junction resistance (R), which varies with the amount of bias provided, and capacitor 22 represents the junction capacitance which is kept as small as possible in order to provide fast switching. As shown in the equivalent circuit of FIG. 2(*b*), when the switch is "on," the diode 14 is biased forward and consequently, the value of R is small and the capacitor is bypassed. As shown in FIG. 2(*c*) when the switch is off, diode 14 is back-biased and R is large. At microwave frequencies, although R is large, it is negligible as compared to $$\frac{1}{\omega C}$$

and therefore the isolation of the switch is limited by C rather than by R.

Figure 4:
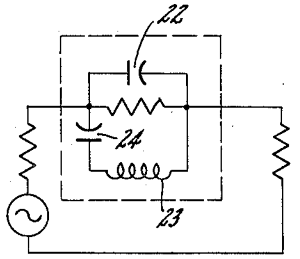
FIG. 4 is a diagrammatic view showing an equivalent circuit of the embodiment shown in FIG. 3 of the drawing.

Referring now to FIG. 3 of the drawings there is shown an arrangement for improving isolation by tuning out C with a shunt. A fine wire 23 has one end attached to the line conductor 11 and is helically wound about the diode 14. The other end of fine wire 23 is returned to the line conductor 11 through capacitor 24 in order to prevent short circuiting the bias. The fine wire 23 acts as a shunt inductance so that at resonance the circuit is open except for finite R. The equivalent circuit of the foregoing described embodiment is shown in FIG. 4 of the drawing.

It can thus be seen that the present invention provides a relatively simple and economical device for increasing the off to on loss ratio in a diode switch. Experimental results have shown a change of off to on loss ratio from 15:1 db without the shunt to 40:1 db with the shunt over a 10 percent bandwidth.

Obviously many modifications and variations of the present invention are possible in the light of the above teachings. It is therefore to be understood, that within the scope of the appended claims, the invention may be practiced otherwise than as specifically described.

What is claimed is:

1. In a microwave switching circuit,
a line conductor,
a crystal diode connected in series with said line conductor,
means for supplying a bias voltage to said crystal diode, and
means shunting said crystal diode for increasing the isolation of said crystal diode.

2. In a microwave switching circuit as set forth in claim 1 wherein said means shunting said crystal diode comprises a fine wire helically wound about said crystal diode and having the ends thereof connected to said line conductor on opposite sides of said crystal diode.

3. In a microwave switching circuit as set forth in claim 2 wherein a capacitor is connected between one end of said fine wire and said line conductor.

4. In a microwave switching circuit,
an outer waveguide,
a line conductor concentrically mounted within said outer waveguide, a crystal diode connected in series with said line conductor,
means for supplying a bias voltage to said crystal diode, and
a fine wire helically wound about and shunting said crystal diode and having the ends thereof connected to said line conductor on opposite sides of said crystal diode.

5. In a microwave switching circuit as set forth in claim 4 wherein a capacitor is connected between one end of said fine wire and said line conductor.

No references cited.